United States Patent
Lee et al.

(10) Patent No.: US 10,112,487 B1
(45) Date of Patent: Oct. 30, 2018

(54) SYSTEM AND METHOD OF MAINTAINING HIGH VOLTAGE BATTERY CHARGING WITH DETECTED AUXILIARY BATTERY FAULT

(71) Applicant: Ford Global Technologies, LLC, Dearborn, MI (US)

(72) Inventors: Josephine S. Lee, Novi, MI (US); Cathleen Tistle, Ann Arbor, MI (US); Jeff Raymond Mohr, Shelby Twp., MI (US); James Brian Keyse, Farmington Hills, MI (US); Jeremy L. Russell, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 11 days.

(21) Appl. No.: 15/490,448

(22) Filed: Apr. 18, 2017

(51) Int. Cl.
| | | |
|---|---|---|
| *B60L 3/04* | (2006.01) | |
| *B60L 11/18* | (2006.01) | |
| *B60L 3/12* | (2006.01) | |
| *G01R 31/36* | (2006.01) | |
| *G01R 31/00* | (2006.01) | |
| *H02J 7/00* | (2006.01) | |
| *H01M 10/48* | (2006.01) | |
| *H01M 10/42* | (2006.01) | |

(52) U.S. Cl.
CPC .................. *B60L 3/04* (2013.01); *B60L 3/12* (2013.01); *B60L 11/1816* (2013.01); *B60L 11/1851* (2013.01); *G01R 31/007* (2013.01); *G01R 31/362* (2013.01); *H01M 10/486* (2013.01); *H02J 7/0021* (2013.01); *H01M 2010/4278* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 7,692,404 B2 | 4/2010 | Harris | |
| 7,705,491 B2 | 4/2010 | King et al. | |
| 7,830,126 B2 | 11/2010 | Kawahara et al. | |
| 8,508,066 B2 * | 8/2013 | Lee ..................... | B60L 11/1803 307/10.1 |
| 9,024,586 B2 | 5/2015 | Vance et al. | |

(Continued)

FOREIGN PATENT DOCUMENTS

JP      3558913 B2      8/2004

*Primary Examiner* — Todd M Melton
(74) *Attorney, Agent, or Firm* — LeClairRyan

(57) ABSTRACT

A system using a computer to be configured to perform particular actions by virtue of having software, firmware, hardware, or a combination installed. One aspect includes a system, programmed to receive a fault signal from an auxiliary battery sensor. The system also determines if a low voltage set point is greater than the main battery voltage, and sends an open switch signal to a battery isolation switch if the low voltage set point is greater than the main battery voltage value. The system will send an auxiliary set point signal to an auxiliary battery charger to maintain a low voltage. The system will receive a current signal from an auxiliary battery sensor to indicate an auxiliary battery current value. The system also determines if the auxiliary battery current is above a maximum current value, and send a disable auxiliary battery maintenance signal to the auxiliary battery charger.

20 Claims, 3 Drawing Sheets

(56) References Cited

U.S. PATENT DOCUMENTS

| | | | |
|---|---|---|---|
| 2016/0072341 A1* | 3/2016 | Tamura | B60L 11/1851 |
| | | | 307/66 |
| 2016/0082855 A1* | 3/2016 | Yoshizawa | B60L 3/0069 |
| | | | 320/136 |
| 2016/0090052 A1 | 3/2016 | Nishijima et al. | |
| 2018/0126866 A1* | 5/2018 | Nozawa | B60L 3/0038 |

* cited by examiner

SYSTEM AND METHOD OF MAINTAINING HIGH VOLTAGE BATTERY CHARGING WITH DETECTED AUXILIARY BATTERY FAULT

BACKGROUND

Electric vehicles are well known in the prior art. Two common variations on such vehicles include; purely electric vehicles, also known as, a battery electric vehicle (BEV) having a rechargeable battery and an electric motor for driving the wheels. The other type of vehicle is the Plug-In Hybrid Electric Vehicles (PHEVs) which includes a combination of electric motor and internal combustion engine drive capability for delivering power to the wheels of the vehicle.

One issue common to both the BEVs and PHEVs is an incomplete high voltage (HV) charging of the PHEV and BEV vehicles with multiple low voltage (LV) batteries. The LV batteries are commonly 12.6 volt lead acid batteries connected to a vehicle's low voltage system, but the LV batteries use any battery chemistry. When a fault is detected in one or more of the LV batteries, the charging of the HV battery can be terminated prematurely. An early termination of the HV charging commonly occurs when the LV system detects a fault with one or more LV batteries. This can occur when the 12.6 volt batteries experiences an issue, such as over heating or battery plates touching and shorting out a cell within the battery.

Therefore there is a need for special handling of the low voltage system when one or more of LV batteries are faulted.

SUMMARY OF THE INVENTION

A system comprising a computer having a processor and a memory. The memory storing instructions executable by the processor are such that the computer is programmed to receive a fault signal from a battery sensor communicatively coupled to a battery. The system receives a voltage signal from a voltage sensor communicatively coupled to a main battery, wherein the voltage signal indicates a main battery voltage value and determines if a low voltage set point value is greater than the main battery voltage value. If the low voltage set point is greater than the main battery voltage value, the system sends an open switch signal to a battery isolation switch and sends an auxiliary set point signal to an auxiliary battery charger to maintain a low voltage value on a low voltage bus of an electric vehicle (EV). The system receives a current signal from an auxiliary battery current sensor communicatively coupled to the auxiliary battery, wherein the current signal indicates an auxiliary battery current value. The system will then determine if the auxiliary battery current value is above an auxiliary battery maximum current value, and send a disable auxiliary battery maintenance signal to the auxiliary battery charger. These and other objects of the present invention will become more apparent from the following description of the preferred embodiments.

DETAILED DESCRIPTION

Figure 1:
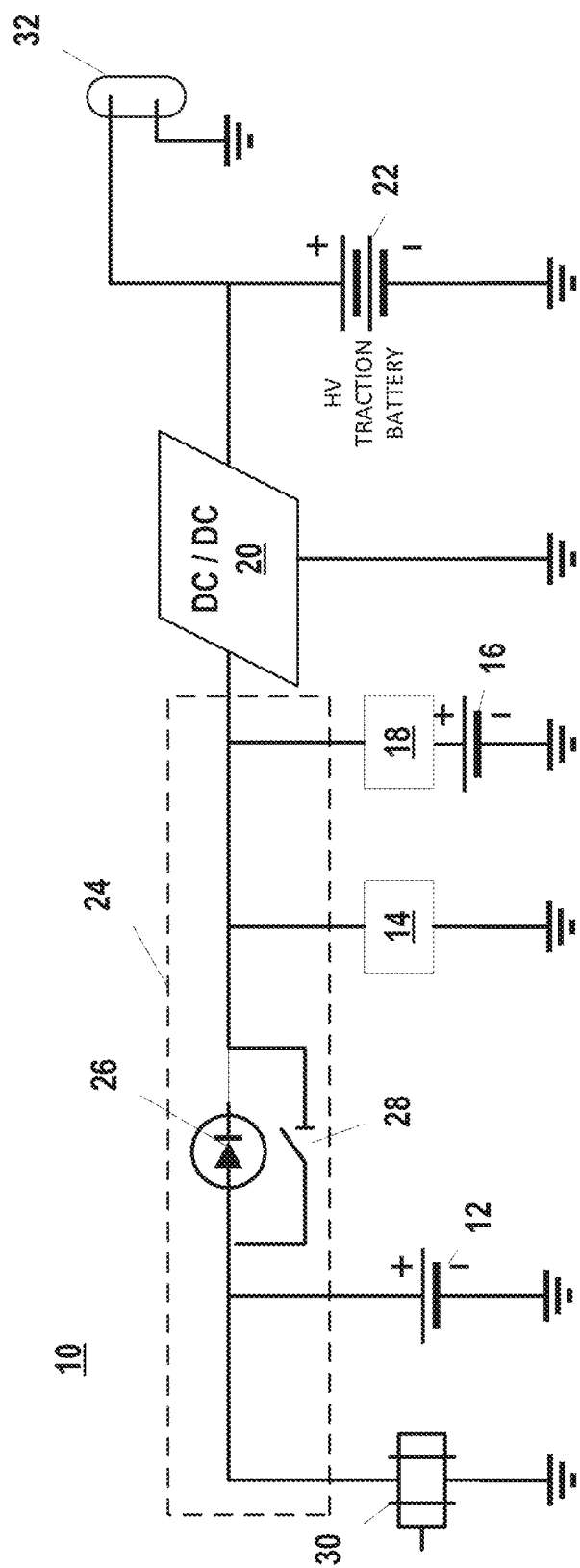
FIG. 1 is a simplified schematic diagram of an electric vehicle (EV) battery system.

With reference to the Figures, wherein like numerals indicate like parts throughout the several views, FIG. 1 illustrates a simplified schematic diagram of an electric vehicle (EV) auxiliary battery current fault system 10. A high voltage (HV) battery 22 is communicatively coupled to an input of a direct current (DC) to DC converter 20. The HV battery 22 is also communicatively coupled to a HV receptacle 32 to permit the EV to be plugged-in when the EV is to be charging. The DC to DC converter 20 can be an electronic circuit that converts a source of DC from one voltage level to another. For example, the HV battery 22 can be a 150 volt battery pack and the DC to DC converter 20 converts the 150 volts to approximately 12.6-13.8 volts, as required by elements attached to a low voltage bus 24 of the EV. In other words, the DC to DC converter 20 converts a high voltage to a low voltage.

One such element connected to the bus 24 is an auxiliary battery 16 and an auxiliary sensor and controller 18 is communicatively connected to the bus 24 and the auxiliary battery 16. The auxiliary sensor and controller 18 can incorporate an ampere sensor (current), a temperature sensor, a voltage sensor and a timer sensor. Additionally, the auxiliary sensor and controller 18 can control the charging and discharging of the auxiliary battery 16.

The bus 24 is also communicatively coupled to an accessory group 14. The accessory group 14 can include among other possibilities, a radio, a heating and air conditioning control, a lighting system, etc.

A diode 26 and a battery isolation circuit (BIC) 28 are positioned between the accessory group 14 and a main battery 12 and also on the bus 24. Although not shown a voltage sensor can be communicatively coupled to the main battery 12 to send a voltage signal to a battery maintenance ECU 54 as shown in FIG. 2.

If no faults are detected, the BIC 28 is normally closed and thus bypassing the diode 26. When a fault is detected, the BIC 28 is open and the diode 26 prevents the main battery 12 from discharging through the faulted auxiliary battery 16. Also located on the on the bus 24 is a starter motor 30 in the event that the EV is a PHEV.

Figure 2:
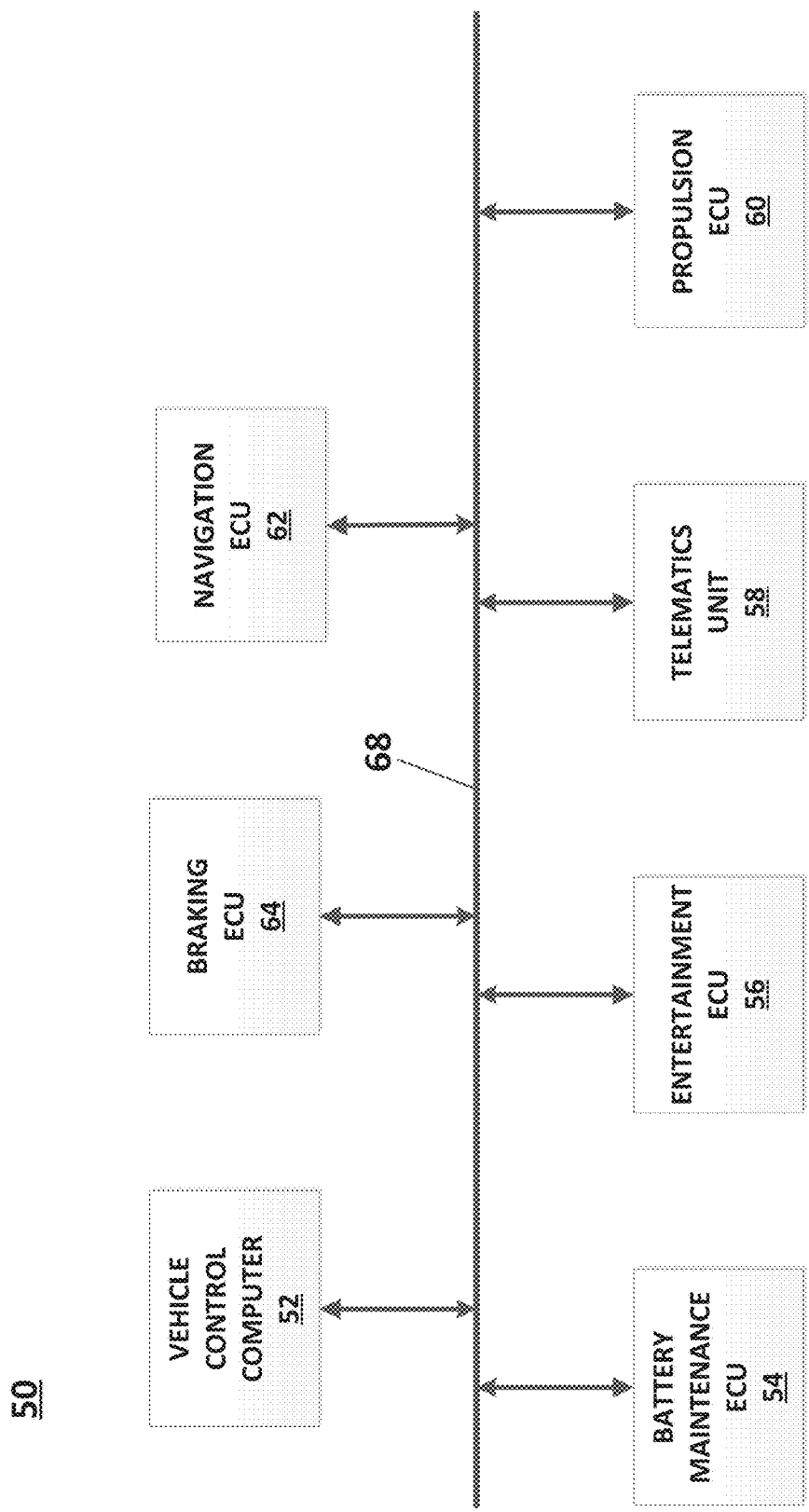
FIG. 2 is a block diagram of an exemplary EV system bus and associated electronic control units (ECUs).

As seen in FIG. 2, various vehicle modules and/or electronic control units (ECUs) may be communicatively connected to each other as well as a vehicle control computer 52. The vehicle control computer 52 can include programming to monitor and control the various vehicle modules and ECUs, as well as any other vehicle components.

The vehicle control computer 52, the battery maintenance ECU 54, as well as the other ECUs and modules discussed below, may have at least one processor and typically have a memory, e.g., comprising various types of permanent and transient memory such as are known to store computer instructions, register values, and temporary and permanent variables. Further, the ECUs and modules can generally include instructions for exchanging data, e.g., from and to a rider or an operator of the vehicle. For example via a mobile device, a smart phone, a portable computer, a user device and/or Human Machine Interface inside the vehicle, which may be one or more of an interactive voice response (IVR) system, a graphical user interface (GUI) including a touchscreen or the like, etc.

The battery maintenance ECU 54 is typically connected to other modules via a vehicle network. One example is a Controller Area Network (CAN) bus such as is known. Other wired and wireless communications can be included in a vehicle network, e.g., Ethernet, Wi-Fi, etc. Further, the vehicle can communicate with other networks or vehicles as described below, and may include wireless networking technologies, e.g., cellular, Wi-Fi®, Bluetooth®, Near Field Communication (NFC), wired and/or wireless packet networks, etc.

A navigation ECU 62 can receive, for example a signal from Global Navigation Satellite System (GNSS) to determine the vehicle's location. The navigation ECU 62 can also plan a route to a destination, for instance, the pickup location of the rider and send a turn by turn instruction to the vehicle control computer 52 to implement.

A propulsion ECU 60 can monitor and control the engines and the motors along with the powertrain system of the vehicle. In the present context, a propulsion system could include a powertrain system including an internal combustion engine and/or electric motor, etc.

A telematics unit 58 or the like is provided for sending and receiving information to a remote network (not shown) to allow the vehicle to have mobile communication via Global System for Mobile Communications (GSM), General Packet Radio Service (GPRS), Wi-Fi, WiMAX, or Long-Term Evolution (4G LTE) technologies to networks, for example, the Internet.

A braking ECU 64 can monitor and control the vehicle's brakes, as well as any parameters affecting the stopping of the vehicle. The braking ECU 64, to exemplify, can stop or slow a vehicle when a forward facing sensor detects an object in front of the vehicle by enabling a braking device affixed to the wheels and axels of the vehicle.

A communication and entertainment ECU 56 can provide the vehicle's access to outside networks, for example, a cellular network or the Internet. The communication and entertainment ECU 56 can also provide the in-vehicle entertainment system, such as, satellite radio or a movie player for the passengers.

Process Flows

Figure 3:
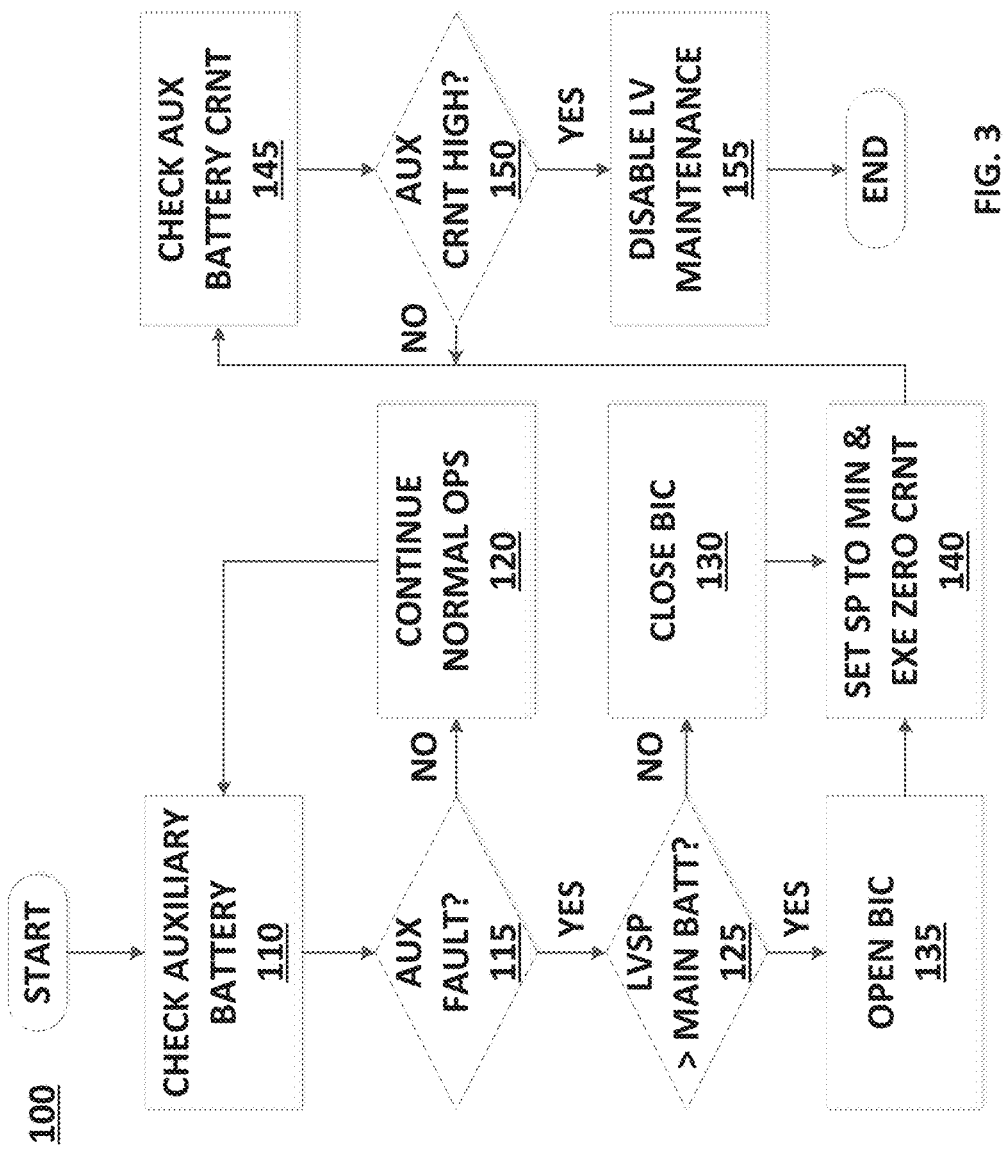
FIG. 3 is a flowchart of an exemplary process that may be implemented in the computer and associated hardware components of the system of FIG. 1.

FIG. 3 is a flow chart illustrating an exemplary process 100 that can be executed according to programming in the battery maintenance ECU 54 to detect a battery fault and isolate the faulted battery and maintain the HV charge.

The process 100 begins in a block 110, in which the battery maintenance ECU 54 receives a fault signal from the sensor and controller 18. The fault signal can be pushed from the sensor and controller 18 and trigger an interrupt in the battery maintenance ECU 54, or alternatively, the battery maintenance ECU 54 can poll the sensor and controller 18 for the presence of the fault.

Next in the block 115, the battery maintenance ECU 54 determines if there is a fault with the auxiliary battery 16 from the fault signal. If a fault is detected, next in a block 125 is executed. If no fault is detected, next in a block 120 is executed.

In the block 120, the battery maintenance ECU 54 will not change any parameters of the EV battery system 10 and the process 100 returns to the block 110.

In the block 125, the battery maintenance ECU 54 determines if a low voltage set point (LVSP) value is greater than the main battery voltage value. The LVSP is a voltage value below a nominal voltage value of the main battery 12, as an example, the LVSP can be set to 12.0 volts and the nominal value for a charging main battery is usually between 12.6 volts and 13.8 volts. Therefore the bus 24 voltage value should be a corresponding 12.6 volts to 13.8 volts. Once the battery maintenance ECU 54 determines that the LVSP value is greater than the bus 24 voltage or the main battery voltage, the process 100 continues to next in a block 125. If the LVSP value is not greater than the bus 24 voltage or the main battery voltage, then the process 100 continues to next in a block 135.

In the block 130, the BIC, if not already closed is instructed to close and allow the main battery 12 to charge or continue charging, and the process 100 continues to next in a block 140.

In the block 135, the BIC is opened to prevent the main battery from discharging, and the process 100 continues to next in the block 140.

In the block 140, which can be entered in from either the blocks 130 and 135, the battery maintenance ECU 54 will set a set point (SP) value that keeps the bus 24 or the main battery 12 at approximately 12.0 volts to 13.8 volts to maintain the variety of car accessories at their normal operating voltages. The battery maintenance ECU 54 can optionally attempt to maintain a zero current flow through the auxiliary battery 16 via the sensor and controller 18. The process 100 continues to next in a block 145.

In a block 145, which can be entered in from either the blocks 140 or 150, the sensor and controller 18 measures a current flow through the auxiliary battery 16. The sensor and controller 18 sends a current signal to the battery maintenance ECU 54 and the process 100 continues to next in the block 150.

In the block 150, the battery maintenance ECU 54 determines if the current flow to or from the auxiliary battery is above an auxiliary battery maximum current value. In one such scenario, the current flowing to the auxiliary battery is 50 amps and the auxiliary battery maximum current value is 25 amps. In this scenario, the process 100 would continue to next in a block 155. If the current flowing to the auxiliary battery is 20 amps and the auxiliary battery maximum current value is 25 amps, the process 100 would return to in the block 145.

In the block 155, the battery maintenance ECU 54 would stop the current flowing to the auxiliary battery 16, for example, the battery maintenance ECU 54 would instruct the sensor and controller 18 to stop charging the auxiliary battery. Alternatively, the battery maintenance ECU 54 would instruct the sensor and controller 18 to totally disengage the auxiliary battery 16 by opening the circuit path between the auxiliary battery 16 and the bus 24.

CONCLUSION

As used herein, the adverb "substantially" modifying an adjective means that a shape, structure, measurement, value, calculation, etc. may deviate from an exact described geometry, distance, measurement, value, calculation, etc., because of imperfections in the materials, machining, manufacturing, sensor measurements, computations, processing time, communications time, etc.

Computing devices such as those discussed herein generally each include instructions executable by one or more computing devices such as those identified above, and for carrying out blocks or steps of processes described above. Computer executable instructions may be compiled or interpreted from computer programs created using a variety of programming languages and/or technologies, including, without limitation, and either alone or in combination, Java', C, C++, C#, Visual Basic, Python, Java Script, Perl, HTML, PHP, etc. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in a computing device is generally a collection of data stored on a computer readable medium, such as a storage medium, a random access memory, etc.

A computer readable medium includes any medium that participates in providing data (e.g., instructions), which may be read by a computer. Such a medium may take many forms, including, but not limited to, non-volatile media, volatile media, etc. Non-volatile media include, for example, optical or magnetic disks and other persistent memory. Volatile media include dynamic random access memory (DRAM), which typically constitutes a main memory. Common forms of computer readable media include, for example, a floppy disk, a flexible disk, hard disk, magnetic tape, any other magnetic medium, a CD ROM, DVD, any other optical medium, punch cards, paper tape, any other physical medium with patterns of holes, a RAM, a PROM, an EPROM, a FLASH EEPROM, any other memory chip or cartridge, or any other medium from which a computer can read.

With regard to the media, processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of systems and/or processes herein are provided for the purpose of illustrating certain embodiments, and should in no way be construed so as to limit the disclosed subject matter.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to claims appended hereto and/or included in a non-provisional patent application based hereon, along with the full scope of equivalents to which such claims are entitled. It is anticipated and intended that future developments will occur in the arts discussed herein, and that the disclosed systems and methods will be incorporated into such future embodiments. In sum, it should be understood that the disclosed subject matter is capable of modification and variation.

What is claimed is:

1. An electric vehicle (EV) auxiliary battery current fault system, comprising:
   a battery maintenance electronic control unit (ECU);
   an auxiliary battery sensor communicatively coupled to an auxiliary battery and the battery maintenance ECU;
   a voltage sensor communicatively coupled to a main battery and the battery maintenance ECU;
   a battery isolation switch;
   a low voltage bus communicatively coupled to at least one of the main battery, the auxiliary battery, the battery isolation switch, and a DC to DC converter; and
   an auxiliary battery sensor and controller communicatively coupled to the auxiliary battery and the battery maintenance ECU.

2. The system of claim 1, further including a diode communicatively coupled to the battery isolation switch to prevent the main battery from discharging when the battery isolation switch is open.

3. The system of claim 1, wherein the DC to DC converter converts a high voltage to a low voltage.

4. The system of claim 1, wherein the battery maintenance ECU further comprises a processor and a memory.

5. The system of claim 4, wherein the battery maintenance ECU is communicatively coupled to a network of the EV.

6. The system of claim 5, wherein the network is a Controller Area Network (CAN) bus.

7. The system of claim 1, wherein the auxiliary battery sensor and controller includes at least one of an ampere sensor, a temperature sensor, a voltage sensor and a timer sensor to determine a fault signal.

8. A system, comprising a computer having a processor and a memory, the memory storing instructions executable by the processor such that the computer is programmed to:
   receive a fault signal from an auxiliary battery sensor and controller communicatively coupled to an auxiliary battery;
   receive a voltage signal from a voltage sensor communicatively coupled to a main battery, wherein the voltage signal indicates a main battery voltage value;
   determine if a low voltage set point value is greater than the main battery voltage value;
   send an open switch signal to a battery isolation switch if the low voltage set point is greater than the main battery voltage value;
   send an auxiliary set point signal to an auxiliary battery charger to maintain a low voltage value on a low voltage bus of an electric vehicle (EV);
   receive a current signal from an auxiliary battery current sensor communicatively coupled to the auxiliary battery, wherein the current signal indicates an auxiliary battery current value;
   determine if the auxiliary battery current value is above an auxiliary battery maximum current value; and
   send a disable auxiliary battery maintenance signal to the auxiliary battery charger.

9. The system of claim 8, further including a diode communicatively coupled to the battery isolation switch to prevent the main battery from discharging when the battery isolation switch is open.

10. The system of claim 8, wherein a high voltage (HV) battery continues to charge when the auxiliary battery charger is disabled.

11. The system of claim 8, wherein the processor and the memory are located in a battery charging computer.

12. The system of claim 11, wherein the battery charging computer is communicatively coupled to a network of the EV.

13. The system of claim 12, wherein the network is a Controller Area Network (CAN) bus.

14. The system of claim 8, wherein the auxiliary battery sensor and controller includes at least one of an ampere sensor, a temperature sensor, a voltage sensor and a timer sensor to determine the fault signal.

15. A method, comprising:
   receiving a fault signal from an auxiliary battery sensor and controller communicatively coupled to an auxiliary battery;

receiving a voltage signal from a voltage sensor communicatively coupled to a main battery, wherein the voltage signal indicates a main battery voltage value;

determining if a low voltage set point value is greater than the main battery voltage value;

sending an open switch signal to a battery isolation switch if the low voltage set point is greater than the main battery voltage value;

sending an auxiliary set point signal to an auxiliary battery charger to maintain a low voltage value on a low voltage bus of an electric vehicle (EV);

receiving a current signal from an auxiliary battery current sensor communicatively coupled to the auxiliary battery, wherein the current signal indicates an auxiliary battery current value;

determining if the auxiliary battery current value is above an auxiliary battery maximum current value; and sending a disable auxiliary battery maintenance signal to the auxiliary battery charger.

16. The method of claim 15, further includes preventing the main battery from discharging when the battery isolation switch is open with a diode communicatively coupled to the battery isolation switch.

17. The method of claim 15, further includes continuing to charge a high voltage (HV) battery when the auxiliary battery charger is disabled.

18. The method of claim 15, wherein a processor and a memory are located in a battery charging computer.

19. The method of claim 18, wherein the battery charging computer is communicatively coupled to a Controller Area Network (CAN) bus of the EV.

20. The method of claim 15, further includes determining the fault signal from at least one of an ampere sensor, a temperature sensor, a voltage sensor and a timer sensor to determine the fault signal.

* * * * *